(12) United States Patent
Rajendiran et al.

(10) Patent No.: US 11,941,290 B2
(45) Date of Patent: Mar. 26, 2024

(54) MANAGING DISTRIBUTION OF PAGE ADDRESSES AND PARTITION NUMBERS IN A MEMORY SUB-SYSTEM

(71) Applicant: Micron Technology, Inc., Boise, ID (US)

(72) Inventors: Bharani Rajendiran, Plesanton, CA (US); Jason Duong, San Jose, CA (US); Chih-Kuo Kao, Fremont, CA (US); Fangfang Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 17/464,186

(22) Filed: Sep. 1, 2021

(65) Prior Publication Data
US 2023/0066419 A1    Mar. 2, 2023

(51) Int. Cl.
*G06F 3/06* (2006.01)
*G11C 11/4094* (2006.01)
*G11C 11/408* (2006.01)

(52) U.S. Cl.
CPC .......... *G06F 3/0659* (2013.01); *G06F 3/0604* (2013.01); *G06F 3/0644* (2013.01); *G06F 3/0673* (2013.01); *G11C 11/4094* (2013.01); *G11C 11/4085* (2013.01)

(58) Field of Classification Search
CPC .... G06F 3/0659; G06F 3/0604; G06F 3/0644; G06F 3/0673; G11C 11/4085; G11C 11/4094
See application file for complete search history.

(56) References Cited

U.S. PATENT DOCUMENTS

| | | | |
|---|---|---|---|
| 9,633,738 B1* | 4/2017 | Guo | G11C 16/30 |
| 2010/0241914 A1* | 9/2010 | Chen | G11C 29/16 |
| | | | 711/E12.001 |
| 2020/0065024 A1* | 2/2020 | Park | G06F 3/0679 |
| 2020/0174819 A1* | 6/2020 | Dong | G06F 13/1668 |
| 2022/0171570 A1* | 6/2022 | Kim | G06F 3/0679 |
| 2022/0269441 A1* | 8/2022 | Kim | G06F 12/0246 |

OTHER PUBLICATIONS

The 11th Lecture, Oct. 6, 2015 titled "The Memory Hierarchy 15-213: Introduction to Computer Systems" available online at https://www.cs.cmu.edu/afs/cs/academic/class/15213-f15/www/lectures/11-memory-hierarchy.pdf and attached to this office aciton. (Year: 2015).*

* cited by examiner

*Primary Examiner* — Michael Krofcheck
*Assistant Examiner* — Janice M. Girouard
(74) *Attorney, Agent, or Firm* — Lowenstein Sandler LLP

(57) ABSTRACT

A memory access command to be performed on a die of a memory device is received, wherein the memory access command comprises a base partition number and a base page address. The memory access command is converted into a plurality of commands based on a number of partitions associated with the die. A respective partition number derived from the base partition number is determined for each command of the plurality of commands. A respective page address associated with each command of the plurality of commands is determined using the base page address. The plurality of commands is executed using, for each command of the plurality of commands, the respective partition number and the respective page address.

20 Claims, 5 Drawing Sheets

MANAGING DISTRIBUTION OF PAGE ADDRESSES AND PARTITION NUMBERS IN A MEMORY SUB-SYSTEM

TECHNICAL FIELD

Embodiments of the disclosure relate generally to memory sub-systems, and more specifically, relate to managing distribution of page addresses and partition numbers in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
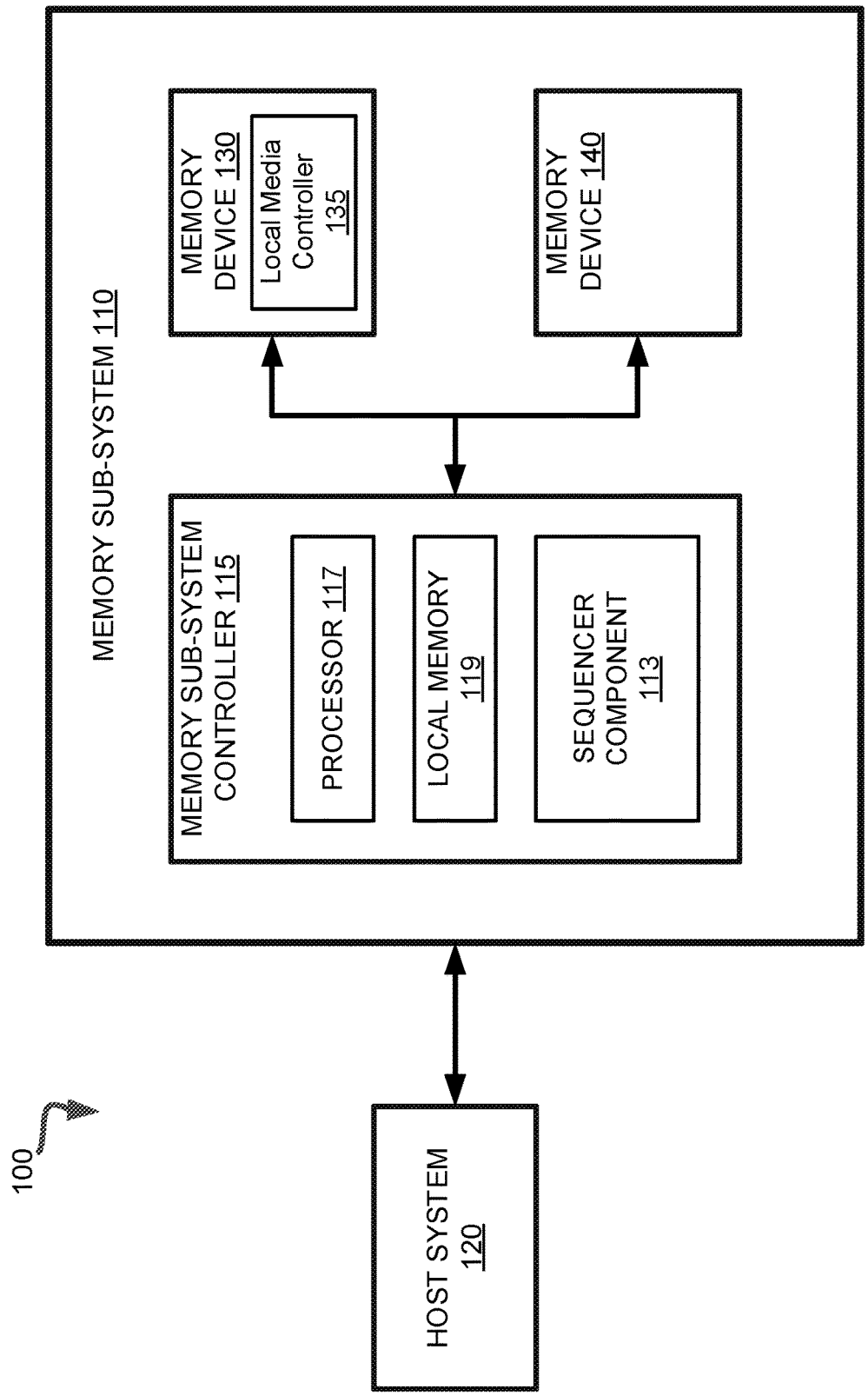
FIG. 1 illustrates an example computing system that includes a memory sub-system in accordance with some embodiments of the present disclosure.

Aspects of the present disclosure are directed to managing distribution of page addresses and partition numbers in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Another example of non-volatile memory devices is a three-dimensional cross-point ("3D cross-point") memory device that is a cross-point array of non-volatile memory that can perform bit storage based on a change of bulk resistance, in conjunction with a stackable cross-gridded data access array. Other examples of non-volatile memory devices are described below in conjunction with FIG. 1. A non-volatile memory device is a package of one or more dies. Each die can consist of one or more partitions. Each partition consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

Partitioning can refer to a process where memory is divided up into sections (e.g., partitions) for use by one or more applications, processes, operations, etc. A die of a memory device can be segmented into two or more partitions. A partition can be individually addressable and can contain information related to a specific application, process, operation, etc.

The memory sub-system controller can include a controller than performs various memory access operations on a particular memory device of the memory sub-system. The memory access operations can be host-initiated operations. For example, the host system can send memory access requests (e.g., write command, read command) to the controller, such as to store data on a memory device at the memory sub-system and to read data from the memory device at the memory sub-system. The memory access requests can include logical address information including a partition number and a page address for the data. The logical address information can be part of metadata for the data. Metadata can also include error handling (e.g., ECC codeword, parity code), data version (e.g., used to distinguish age of data written), valid bitmap, etc.

A memory cell can be programmed (written to) by applying a certain voltage to the memory cell, which results in an electric charge being held by the memory cell. Certain voltages can be applied to memory cells through a power bus connected to a periphery circuit of the memory device. Given the physical layout of the memory device, memory cells can be located at different distances from the periphery circuit. Due to this layout constraint, there can be a power drop or delay in reaching certain memory cells of the memory device, which can result in voltage differences among the memory cells. Voltage differences among the memory cells can result in differences in the raw bit error rates (RBER) of each memory cell. For example, one memory cell in one location of the memory device can have a higher RBER than another memory cell in another location of the memory device. Thus, the reliability of the data stored at each memory cell is reduced.

In some memory sub-systems, a controller can include a sequencer component that is used to manage memory access operations at the memory device. The sequencer component can receive a memory access command (e.g., a write command) that is to be performed with respect to the memory sub-system and can further receive the data corresponding to the command (e.g., data to be written to a memory cell). In some memory sub-systems, the sequencer component can perform the memory access operations in a sequential manner, i.e., the sequencer component can perform the memory access operations based on sequential physical addresses identifying groups of memory cells on the memory device. However, when performing the memory access operations using sequential physical addresses, locality issues affecting the reliability of data on the memory device can arise.

Aspects of the present disclosure address the above and other deficiencies by providing a memory sub-system that manages the distribution of page addresses and partition numbers for a memory access command. In certain embodiments, a sequencer component of a memory sub-system controller can receive a memory access command to be performed with respect to a memory device of the memory sub-system. The memory access command can include a base partition number and a base page address. The base partition number and the base page address can each be a set of bits representing a starting partition and starting page number on which to perform the memory access command. The sequencer component can convert the memory access command into a set of commands (e.g., partition-specific commands). The sequencer component can determine a respective partition number for each command of the set of commands based on the base partition number. For example, the sequencer component can increment the base partition number for each command of the set of commands. Each incremented base partition number can be set as the partition number for a command of the set of commands. The sequencer component can determine, using the base page address, a respective page address for each command of the set of commands. For example, the sequencer component can increment the base page address for each command of the set of commands. The sequencer component can increment the base page address in response to determining that a partition number for a command of the set of commands satisfies a threshold criterion. For example, the sequencer component can determine that the partition number for a command satisfies the threshold criterion in response to determining that the partition number is the maximum partition number in the die (e.g., the maximum partition number in the die is 32). The sequencer component can execute each command of the set of commands using the respective partition number and respective page number.

In certain embodiments, the sequencer component can receive a memory access command to be performed with respect to the memory device of the memory sub-system. The memory access command can include a base partition number and a base page address. The sequencer component can remap each bit representing the base partition number to another set of bits on the die. The sequencer component can convert the memory access command into a set of commands (e.g., partition-specific commands). The sequencer component can determine a respective partition number for each command of the set of commands based on the base partition number. For example, the sequencer component can increment the base partition number for each command of the set of commands. Each incremented base partition number can be set as the partition number for a command of the set of commands. The sequencer component can determine, using the base page address, a respective page address for each command of the set of commands. For example, the sequencer component can increment the base page address for each command of the set of commands. The sequencer component can increment the base page address in response to determining that a partition number for a command of the set of commands satisfies a threshold criterion. For example, the sequencer component can determine that the partition number for a command satisfies the threshold criterion in response to determining that the partition number is the maximum partition number in the die (e.g., the maximum partition number in the die is 32). The sequencer component can execute each command of the set of commands using the respective partition number and respective page number.

Advantages of the present disclosure include, but are not limited to, improving the reliability of data stored at the memory device. As discussed herein above, due to the physical layout of a memory device, there can be voltage differences among the memory cells in a die of the memory device, which can result in differences in the raw bit error rates (RBER) of each memory cell, resulting in lost or corrupted data. This issue can arise in some memory sub-systems when memory access operations are performed on sequential physical addresses of the memory device. By redistributing the addresses of each memory access operation and remapping the partition number for each memory access operation, reliability of data stored at the memory device can be improved since the memory access operation is not performed on data having sequential addresses. As the reliability of data is improved, the reliability and performance of the memory device as a whole is also improved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a sequencer component 113 that can manage distribution of page addresses and partition numbers of memory access operations on a memory device (e.g., the memory device 130). In some embodiments, the memory sub-system controller 115 includes at least a portion of the sequencer component 113. In some embodiments, the sequencer component 113 is part of the host system 110, an application, or an operating system. In other embodiments, local media controller 135 includes at least a portion of sequencer component 113 and is configured to perform the functionality described herein.

The sequencer component 113 can receive a memory access command (e.g., a write command) that is to be performed with respect to the memory device of the memory sub-system. The memory access command can include a base partition number and a base page address. The sequencer component 113 can convert the memory access command into a set of commands (e.g., partition-specific commands). The sequencer component 113 can determine a respective partition number for each command of the set of commands based on the base partition number. For example, the sequencer component 113 can increment the base partition number for each command of the set of commands. Each incremented base partition number can be set as the partition number for a command of the set of commands. The sequencer component 113 can determine, using the base page address, a respective page address for each command of the set of commands. For example, the sequencer component 113 can increment the base page address for each command of the set of commands in response to determining that a value of a partition number for a command of the set of commands satisfies a threshold criterion. For example, the sequencer component 113 can determine that the partition number for a command satisfies the threshold criterion in response to determining that the partition number is the maximum partition number in the die (e.g., the maximum partition number in the die is 32). The sequencer component 113 can execute each command of the set of commands using the respective partition number and the respective page number.

In certain embodiments, the sequencer component 113 can receive a memory access command that is to be performed with respective to the memory device of the memory sub-system. The memory access command can include a base partition number and a base page address. The sequencer component 113 can remap each bit representing the base partition number to another set of bits on the die. The sequencer component 113 can convert the memory access command into a set of commands (e.g., partition-specific commands). The sequencer component 113 can determine a respective partition number for each command of the set of commands based on the base partition number. For example, the sequencer component 113 can increment the base partition number for each command of the set of commands. Each incremented base partition number can be set as the partition number for a command of the set of commands. The sequencer component 113 can determine, using the base page address, a respective page address for each command of the set of commands. For example, the sequencer component 113 can increment the base page address in response to determining that a partition number for a command of the set of commands satisfies a threshold criterion. For example, the sequencer component 113 can determine that the partition number for a command satisfies the threshold criterion in response to determining that the partition number is the maximum partition number in the die (e.g., the maximum partition number in the die is 32). The sequencer component 113 can execute each command using the respective partition number and the respective page number.

Further details with regards to the operations of the sequencer component 113 are described below.

Figure 2:
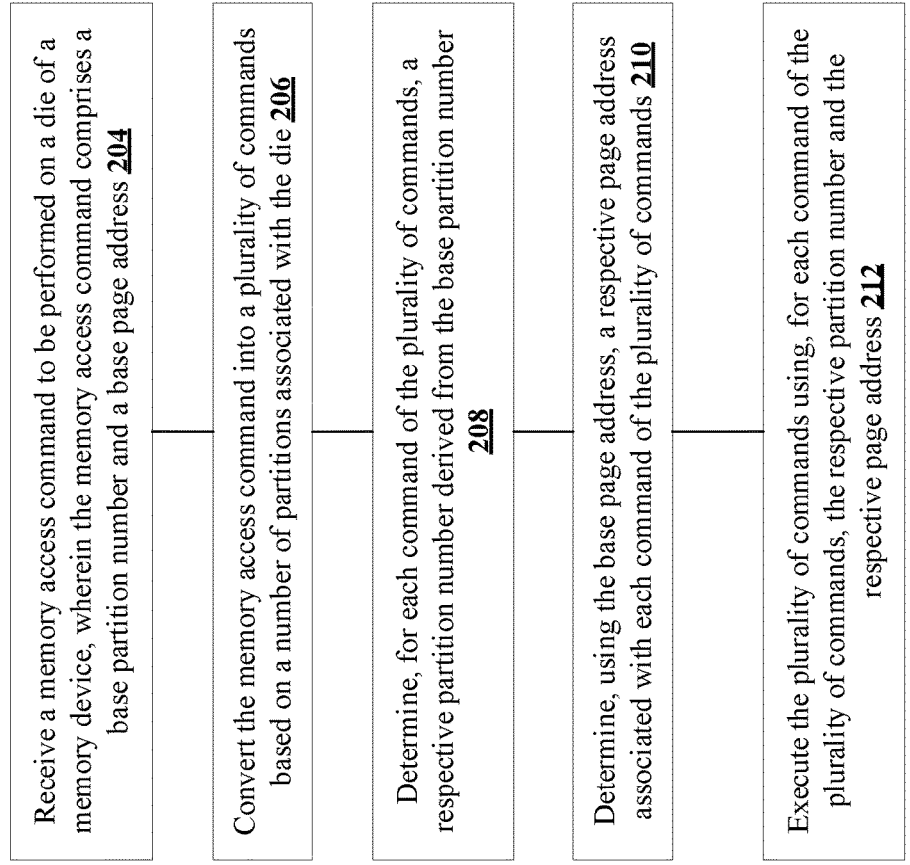
FIG. 2 is a flow diagram of an example method to manage distribution of page addresses and partition numbers, in accordance with some embodiments of the present disclosure.

FIG. 2 is a flow diagram of an example method 200 to manage distribution of page addresses and partition numbers for memory access operations of a memory device, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the sequencer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 204, the processing logic receives a memory access command to be performed on a die of the memory device. The memory access command can include a base partition number and a base page address. The processing logic can receive the memory access command from a host system. In some embodiments, the base partition number and the base page address can be represented using one or more sets of bits. For example, the base partition number can be represented using a set of five bits. The base page address can be represented using a set of twenty-six bits.

At operation 206, the processing logic converts the memory access command into a set of commands. In some embodiments, the processing logic can determine the number of partitions associated with the die. The processing logic can convert the memory access command into a set of commands based on the number of partitions associated with the die. For example, the processing logic can convert the memory access command into a set of commands equal in number to the number of partitions associated with the die. In some embodiments, the set of commands can be a set of partition-specific commands to be performed on the die of the memory device.

At operation 208, the processing logic determines, for each command of the plurality of commands, a respective partition number. In some embodiments, determining the respective partition number for each command of the set of commands can include deriving the respective partition number from the base partition number. In some embodiments, deriving the respective partition number from the base partition number can include setting the partition number for a command of the set of commands to be equal to the base partition number. In some embodiments, the processing logic can increment the base partition number by a fixed value (e.g., 1) for another partition number for another command of the set of commands. For example, the base partition number can be 25. For example, the processing logic can set a partition number for a command equal to the base partition number (e.g., 25). The processing logic can increment the partition number by a fixed value (e.g., 1). For example, the partition number for the command can be 25. The processing logic can increment 25 by a fixed value of 1, i.e., the incremented value is 26. The processing logic can set the partition number for another command to be equal to the incremented value. For example, the processing logic can set the partition number of the other command equal to the incremented value (e.g., 26 as described in the example above). In some embodiments, the processing logic can determine that the partition number for the command does not satisfy a threshold criterion. For example, the processing logic can determine that the partition number for the command is less than or equal to a maximum value associated with a partition of the die. In some embodiments, the maximum value associated with the partition of the die can be equal to the maximum number of partitions that are allowed on the die. For example, the maximum number of partitions allowed on the die can be 32 partitions. The maximum number of partitions allowed on the die can be based on physical characteristics of the memory device. In response to determining that the partition number for the command does not satisfy the threshold criterion, the processing logic can increment the partition number by a fixed value (e.g., 1) for another command of the set of commands. In some embodiments, the processing logic can determine that the partition number for the command satisfies the threshold criterion. For example, the processing logic can determine that the partition number for the command exceeds the maximum value associated with a partition of the die. In response to determining that the partition number for the command satisfies the threshold criterion, the processing logic can set the partition number for another command equal to an initial value. The initial value can be an initial value of the number of partitions of the die. For example, the initial value can be 0, i.e. the partition number can be set to partition 0 of the die. In some embodiments, each partition number can be stored in a corresponding entry of a data structure, e.g., a table. The data structure can be associated with the die of the memory device and/or the memory device. In some embodiments, incrementing a partition number can include updating the corresponding entry of the data structure.

At operation 210, the processing logic determines, using the base page address, a page address associated with each command of the set of commands. In some embodiments, determining the page address associated with each command of the set of commands can include identifying that the partition number of the command of the set of commands does not satisfy the threshold criterion (e.g., the partition number is less than or equal to the maximum value associated with a partition of the die). In response to determining that the partition number of the command does not satisfy the threshold criterion, the processing logic can update a page address of another command of the set of commands with an address equal to the base page address. For example, the processing logic can update the page address of the other command with the base page address (e.g., 5), i.e., the page address of the other command can be set equal to 5. In some embodiments, the processing logic can determine that the partition number of the command of the set of commands satisfies the threshold criterion (e.g., the partition number exceeds the maximum value associated with a partition of the die). In response to determining that the partition number of the command satisfies the threshold criterion, the processing logic can increment a page address of the command. In some embodiments, the processing logic can increment the page address by a fixed value (e.g., 1). The processing logic can update the page address associated with the other command with the incremented page address. For example, if the page address of the command is 5, the processing logic can increment the page address to 6 and update the page address of the other command to 6. In some embodiments, each page address can be stored in a corresponding entry of a data structure, e.g., a table. The data structure can be associated with the die of the memory device and/or the memory device. In some embodiments, incrementing a page address can include updating the corresponding entry of the data structure.

In some embodiments, in response to determining the respective page address associated with each command of the set of commands, the processing logic can identify a partition offset associated with the die of the memory device. In some embodiments, the partition offset can be identified based on offline media characterization of the memory device, where the memory device is characterized to balance out an error rate (e.g., RBER) associated with the memory device. The processing logic can identify a set of wordlines corresponding to the page address associated with each command of the set of commands. In some embodiments, the processing logic can identify the set of wordlines based on a bitmap of the page address. For example, the bitmap can include a set of bits (e.g., 26 bits) representing the page address. The processing logic can identify, using the bitmap, one or more bits of the bitmaps representing the set of wordlines. The processing logic can update each wordline of the set of wordlines based on the partition offset. Updating each wordline based on the partition offset can include additively computing the value associated with each wordline to the partition offset. The computed value can be multiplied by a total number of wordlines of the die. In some embodiments, the processing logic can identify a set of bitlines corresponding to the page address associated with each command of the set of commands. In some embodiments, the processing logic can identify the set of bitlines based on a bitmap of the page address. For example, the bitmap can include a set of bits (e.g., 26 bits) representing the page address. The processing logic can identify, using the bitmap, one or more bits of the bitmap representing the set of bitlines. The processing logic can update each bitline of the set of bitlines based on the partition offset. Updating each bitline based on the partition offset can include additively computing the value associated with each bitline to the partition offset. The computed value can be multiplied by a total number of bitlines of the die.

In some embodiments, in response to updating each wordline and/or each bitline based on the partition offset, the processing logic can de-swizzle the page address associated with each command of the set of commands. De-swizzling can include remapping the physical page address associated with each command of the set of commands to a corresponding logical page address associated with each command of the set of commands.

At operation 212, the processing logic executes the set of commands. In some embodiments, executing the set of commands includes executing each command of the set of command. The processing logic can execute the set of commands using the respective partition number associated with each command of the set of the commands and the respective page address associated with each command of the set of commands.

Figure 3:
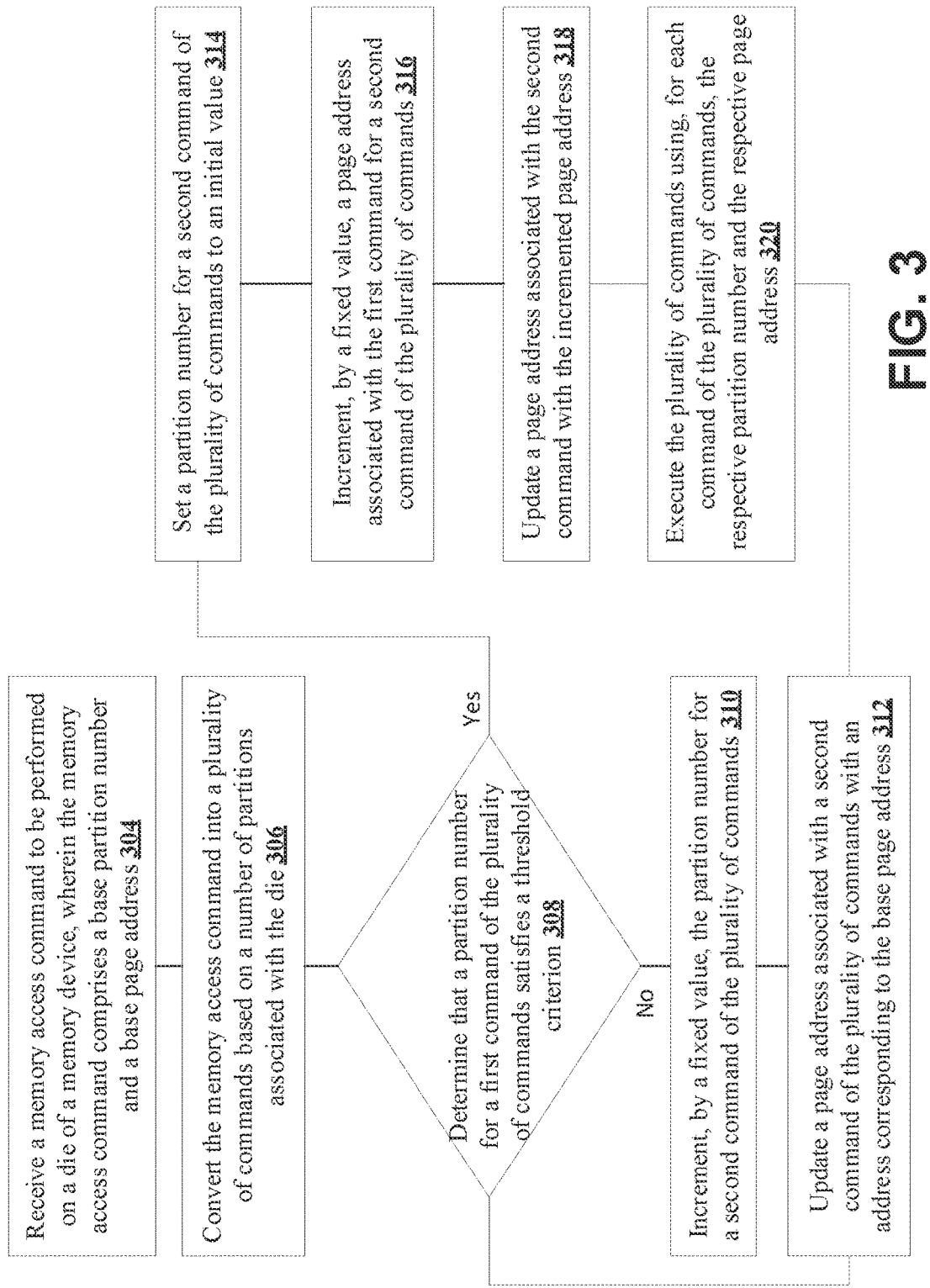
FIG. 3 is a flow diagram of an example method to manage distribution of page addresses and partition numbers, in accordance with some embodiments of the present disclosure.

FIG. 3 is a flow diagram of an example method 300 to manage distribution of page addresses and partition numbers for memory access operations of a memory device, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the sequencer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 304, the processing logic receives a memory access command to be performed on a die of the memory device. The memory access command can include a base partition number and a base page address. The processing logic can receive the memory access command from a host system. In some embodiments, the base partition number and the base page address can be represented using one or more sets of bits. For example, the base partition number can be represented using a set of five bits. The base page address can be represented using a set of twenty-six bits.

At operation 306, the processing logic converts the memory access command into a set of commands. In some embodiments, the processing logic can determine the number of partitions associated with the die. The processing logic can convert the memory access command into a set of commands based on the number of partitions associated with the die. For example, the processing logic can convert the memory access command into a set of commands equal in number to the number of partitions associated with the die. In some embodiments, the set of commands can be a set of partition-specific commands to be performed on the die of the memory device.

At operation 308, the processing logic can determine whether a partition number for a command of the set of commands satisfies a threshold criterion. The threshold criterion can specify the maximum number of partitions that are allowed on the die. For example, the maximum number of partitions allowed on the die can be 32 partitions. The maximum number of partitions allowed on the die can be based on physical characteristics of the memory device.

At operation 310, the processing logic can determine that the partition number for the command does not satisfy the threshold criterion. For example, the processing logic can determine that the partition number for the command is less than or equal to the maximum value associated with a partition of the die. In response to determining that the partition number for the command does not satisfy the threshold criterion, the processing logic can increment the base partition number by a fixed value (e.g., 1) for another partition number for another command of the set of commands in response to determining that the partition number for the command does not satisfy the threshold criterion. For example, the base partition number can be 25. The processing logic can set a partition number for a command equal to the base partition number (e.g., 25). The processing logic can increment the partition number by a fixed value (e.g., 1). For example, the partition number for the command can be 25. The processing logic can increment 25 by a fixed value of 1, i.e., the incremented value is 26. The processing logic can set the partition number for another command to be equal to the incremented value. For example, the processing logic can set the partition number of the other command equal to the incremented value (e.g., 26 as described in the example above).

At operation 312, in response to determining that the partition number for the command does not satisfy the threshold criterion, the processing logic can update a page address of another command of the set of commands with an address equal to the base page address. For example, the processing logic can update the page address of the other command with the base page address (e.g., 5), i.e., the page address of the other command can be set equal to 5.

At operation 314, the processing logic the processing logic can determine that the partition number for the command satisfies the threshold criterion. For example, the processing logic can determine that the value of the partition number exceeds the maximum value associated with a partition of the die. In response to determining that the partition number for the command satisfies the threshold criterion, the processing logic can set the partition number for another command equal to an initial value. The initial value can be an initial value of the number of partitions of the die. For example, the initial value can be 0, i.e. the partition number can be set to partition 0 of the die.

At operation 316, in response to determining that the partition number for the command satisfies the threshold criterion, the processing logic can increment a page address of the command. In some embodiments, the processing logic can increment the page address by a fixed value (e.g., 1).

At operation 318, in response to incrementing the page address, the processing logic can update the page address associated with the other command with the incremented page address. For example, if the page address of the command is 5, the processing logic can increment the page address to 6 and update the page address of the other command to 6.

At operation 320, the processing logic executes the set of commands. In some embodiments, can execute the set of commands includes executing each command of the set of command. The processing logic can execute the set of commands using the respective partition number associated with each command of the set of the commands and the respective page address associated with each command of the set of commands.

Figure 4:
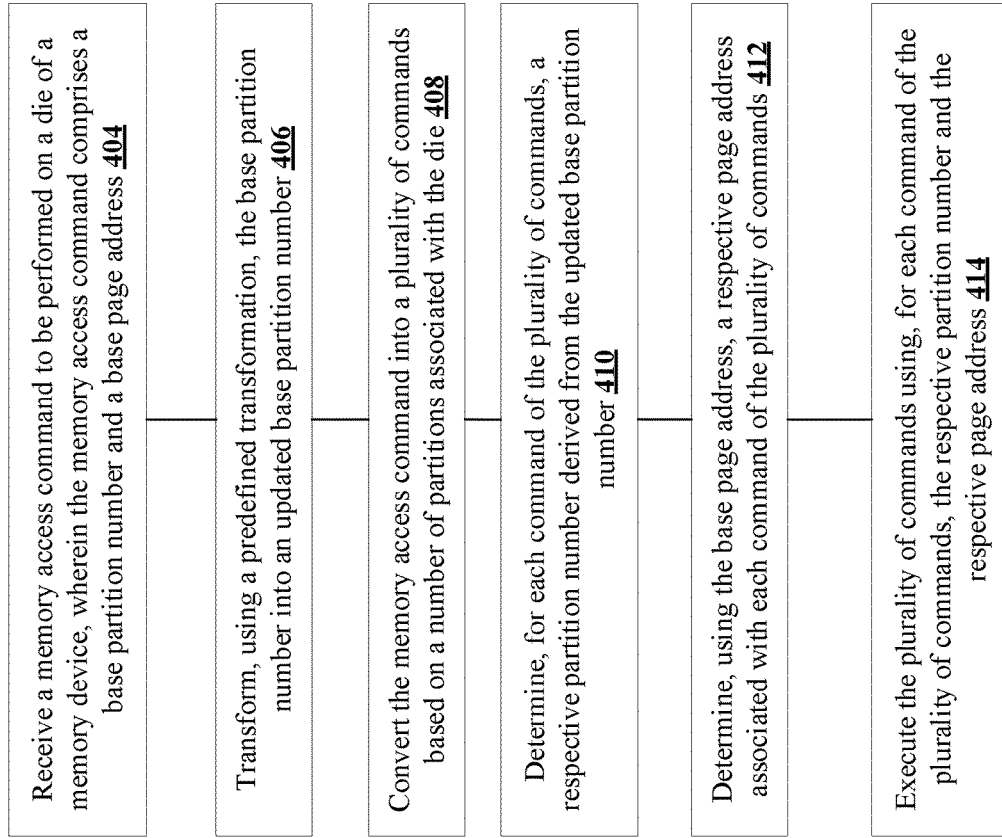
FIG. 4 is a flow diagram of an example method to manage distribution of page addresses and partition numbers, in accordance with some embodiments of the present disclosure.

FIG. 4 is a flow diagram of an example method 400 to manage distribution of page addresses and partition numbers for memory access operations of a memory device, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the sequencer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 404, the processing logic receives a memory access command to be performed on a die of the memory device. The memory access command can include a base partition number and a base page address. The processing logic can receive the memory access command from a host system. In some embodiments, the base partition number and the base page address can be represented using one or more sets of bits. For example, the base partition number can be represented using a set of five bits. The base page address can be represented using a set of twenty-six bits.

At operation 406, the processing logic transforms, using a predefined transformation, the base partition into an updated base partition number. In some embodiments, transforming the base partition can include updating a bitmap associated with the base partition number. In some embodiments, the bitmap can be a configurable register value of the memory device. Updating the bitmap can include updating the value in the register with the base partition number. In some embodiments, the predefined transformation can be based on offline media characterization of the memory device. In some embodiments, the processing logic transforms the base partition in response to determining that there is no request to perform a memory access operation (e.g., the sequencer component 113 of FIG. 1 is in an idle state).

At operation 408, the processing logic converts the memory access command into a set of commands. In some embodiments, the processing logic can determine the number of partitions associated with the die. The processing logic can convert the memory access command into a set of commands based on the number of partitions associated with the die. For example, the processing logic can convert the memory access command into a set of commands equal in number to the number of partitions associated with the die. In some embodiments, the set of commands can be a set of partition-specific commands to be performed on the die of the memory device.

At operation 410, the processing logic determines, for each command of the plurality of commands, a respective partition number. In some embodiments, determining the respective partition number for each command of the set of commands can include deriving the respective partition number from the updated base partition number. In some embodiments, deriving the respective partition number from the updated base partition number can include setting the partition number for a command of the set of commands to be equal to the updated base partition number. In some embodiments, the processing logic can increment the updated base partition number by a fixed value (e.g., 1) for another partition number for another command of the set of commands. For example, the updated base partition number can be 25. For example, the processing logic can set a partition number for a command equal to the updated base partition number (e.g., 25). The processing logic can increment the partition number by a fixed value (e.g., 1). For example, the partition number for the command can be 25. The processing logic can increment 25 by a fixed value of 1, i.e., the incremented value is 26. The processing logic can set the partition number for another command to be equal to the incremented value. For example, the processing logic can set the partition number of the other command equal to the incremented value (e.g., 26 as described in the example above). In some embodiments, the processing logic can determine that the partition number for the command does not satisfy a threshold criterion. For example, the processing logic can determine that the partition number for the command is less than or equal to a maximum value associated with a partition of the die. In some embodiments, the maximum value associated with the partition of the die can be equal to the maximum number of partitions that are allowed on the die. For example, the maximum number of partitions allowed on the die can be 32 partitions. The maximum number of partitions allowed on the die can be based on physical characteristics of the memory device. In response to determining that the partition number for the command does not satisfy the threshold criterion, the processing logic can increment the partition number by a fixed value (e.g., 1) for another command of the set of commands. In some embodiments, the processing logic can determine that the partition number for the command satisfies the threshold criterion. For example, the processing logic can determine that the partition number for the command exceeds the maximum value associated with a partition of the die. In response to determining that the partition number for the command satisfies the threshold criterion, the processing logic can set the partition number for another command equal to an initial value. The initial value can be an initial value of the number of partitions of the die. For example, the initial value can be 0, i.e. the partition number can be set to partition 0 of the die. In some embodiments, each partition number can be stored in a corresponding entry of a data structure, e.g., a table. The data structure can be associated with the die of the memory device and/or the memory device. In some embodiments, incrementing a partition number can include updating the corresponding entry of the data structure.

At operation 412, the processing logic determines, using the base page address, a page address associated with each command of the set of commands. In some embodiments, determining the page address associated with each command of the set of commands can include identifying that the partition number of the command of the set of commands does not satisfy the threshold criterion (e.g., the partition number is less than or equal to the maximum value associated with a partition of the die). In response to determining that the partition number of the command does not satisfy the threshold criterion, the processing logic can update a page address of another command of the set of commands with an address equal to the base page address. For example, the processing logic can update the page address of the other command with the base page address (e.g., 5), i.e., the page address of the other command can be set equal to 5. In some embodiments, the processing logic can determine that the partition number of the command of the set of commands satisfies the threshold criterion (e.g., the partition number exceeds the maximum value associated with a partition of the die). In response to determining that the partition number of the command satisfies the threshold criterion, the processing logic can increment a page address of the command. In some embodiments, the processing logic can increment the page address by a fixed value (e.g., 1). The processing logic can update the page address associated with the other command with the incremented page address. For example, if the page address of the command is 5, the processing logic can increment the page address to 6 and update the page address of the other command to 6. In some embodiments, each page address can be stored in a corresponding entry of a data structure, e.g., a table. The data structure can be associated with the die of the memory device and/or the memory device. In some embodiments, incrementing a page address can include updating the corresponding entry of the data structure.

In some embodiments, in response to determining the respective page address associated with each command of the set of commands, the processing logic can identify a partition offset associated with the die of the memory device. In some embodiments, the partition offset can be identified based on offline media characterization of the memory device, where the memory device is characterized to balance out an error rate (e.g., RBER) associated with the memory device. The processing logic can identify a set of wordlines corresponding to the page address associated with each command of the set of commands. In some embodiments, the processing logic can identify the set of wordlines based on a bitmap of the page address. For example, the bitmap can include a set of bits (e.g., 26 bits) representing the page address. The processing logic can identify, using the bitmap, one or more bits of the bitmaps representing the set of wordlines. The processing logic can update each wordline of the set of wordlines based on the partition offset. Updating each wordline based on the partition offset can include additively computing the value associated with each wordline to the partition offset. The computed value can be multiplied by a total number of wordlines of the die. In some embodiments, the processing logic can identify a set of bitlines corresponding to the page address associated with each command of the set of commands. In some embodiments, the processing logic can identify the set of bitlines based on a bitmap of the page address. For example, the bitmap can include a set of bits (e.g., 26 bits) representing the page address. The processing logic can identify, using the bitmap, one or more bits of the bitmaps representing the set of bitlines. The processing logic can update each bitline of the set of bitlines based on the partition offset. Updating each bitline based on the partition offset can include additively computing the value associated with each bitline to the partition offset. The computed value can be multiplied by a total number of bitlines of the die.

In some embodiments, in response to applying the partition offset to each wordline and/or each bitline of the die, the processing logic can de-swizzle the page address associated with each command of the set of commands. De-swizzling can include remapping the physical page address associated with each command of the set of commands to a corresponding logical page address associated with each command of the set of commands.

At operation 414, the processing logic executes the set of commands. In some embodiments, executing the set of commands includes executing each command of the set of command. The processing logic can execute the set of commands using the respective partition number associated with each command of the set of the commands and the respective page address associated with each command of the set of commands.

Figure 5:
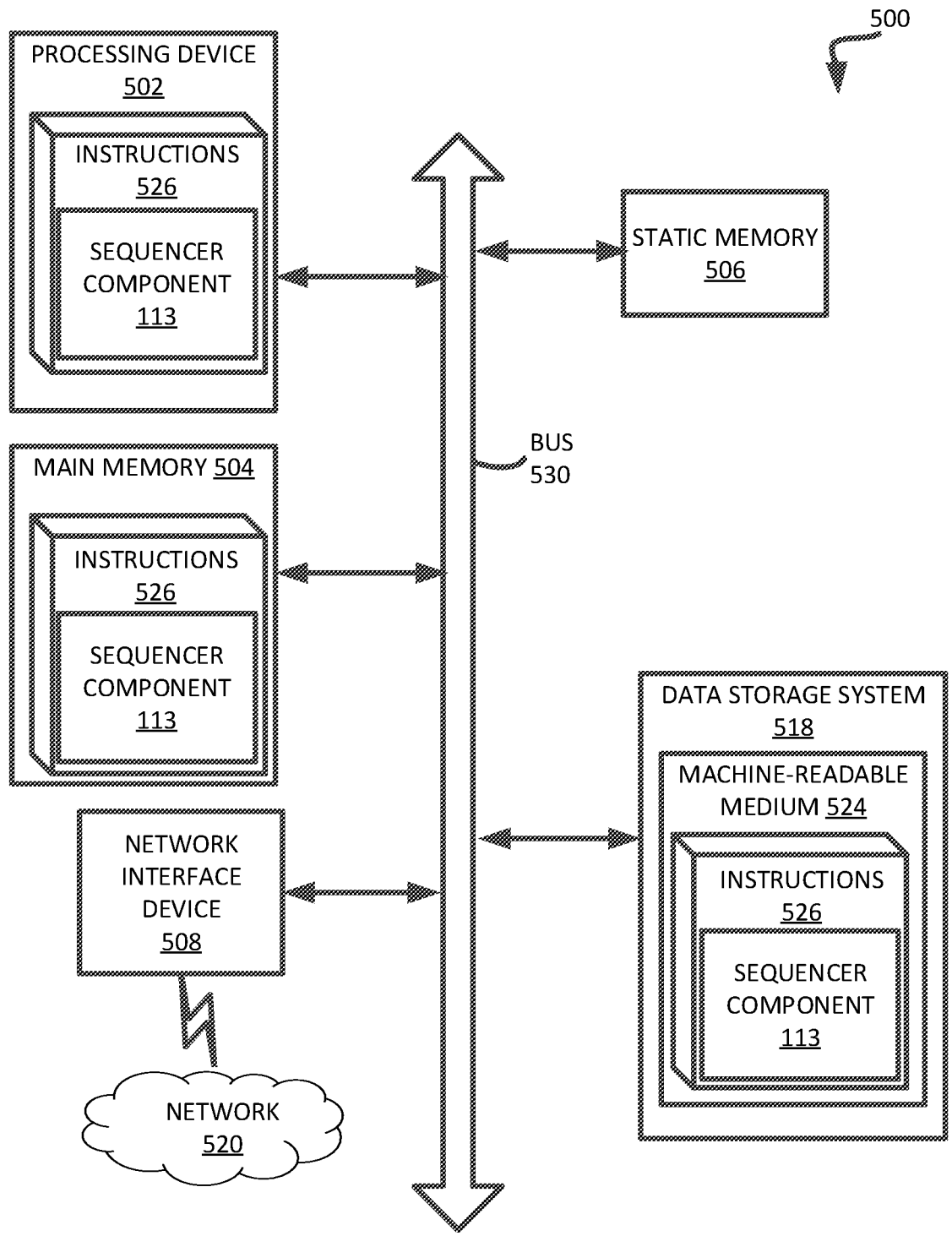
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the write disturb management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 604 can correspond to the memory sub-system 110 of FIG. 1.

In one embodiment, the instructions 526 include instructions to implement functionality corresponding to a sequencer component (e.g., the sequencer component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
receiving a memory access command to be performed on a die of the memory device, wherein the memory access command comprises a base partition number and a base page address;
determining a number of partitions associated with the die;
converting the memory access command into a plurality of commands, wherein a number of commands comprised by the plurality of commands is equal to the number of partitions associated with the die;
determining, for each command of the plurality of commands, a respective partition number derived from the base partition number;
in response to determining that a first partition number for a first command of the plurality of commands satisfies a threshold criterion, setting a second partition number for a second command of the plurality of commands to an initial value;
determining, using the base page address, a respective page address associated with each command of the plurality of commands; and
executing the plurality of commands using, for each command of the plurality of commands, the respective partition number and the respective page address.

2. The system of claim 1, wherein the first partition number for the first command of the plurality of commands is the base partition number incremented by a fixed value.

3. The system of claim 1, further comprising:
identifying a partition offset associated with the die;
identifying a plurality of wordlines corresponding to the page address associated with each command of the plurality of commands; and
updating each wordline of the plurality of wordlines based on the partition offset.

4. The system of claim 1, further comprising:
identifying a partition offset associated with the die;

identifying a plurality of bitlines corresponding to the page address associated with each command of the plurality of commands; and
updating each bitline of the plurality of bitlines based on the partition offset.

5. The system of claim 1, further comprising:
determining that the first partition number for the first command of the plurality of commands does not satisfy a threshold criterion; and
responsive to determining that the first partition number for the first command of the plurality of commands does not satisfy the threshold criterion, incrementing the first partition number by the fixed value for the second command of the plurality of commands.

6. The system of claim 1, wherein determining, using the base page address, the respective page address associated with each command of the plurality of commands comprises:
determining that the first partition number for the first command of the plurality of commands does not satisfy a threshold criterion; and
responsive to determining that the first partition number for the first command of the plurality of commands does not satisfy the threshold criterion, updating a page address associated with the second command of the plurality of commands with an address corresponding to the base page address.

7. The system of claim 1, wherein determining, using the base page address, the respective page address associated with each command of the plurality of commands comprises:
determining that the first partition number for the first command of the plurality of commands satisfies a threshold criterion;
incrementing, by a fixed value, a page address associated with the first command for the second command of the plurality of commands; and
updating a page address associated with the second command with the incremented page address.

8. A method comprising:
receiving a memory access command to be performed on a die of a memory device, wherein the memory access command comprises a base partition number and a base page address;
transforming, using a predefined transformation, the base partition number into an updated base partition number;
determining a number of partitions associated with the die;
converting the memory access command into a plurality of commands, wherein a number of commands comprised by the plurality of commands is equal to the number of partitions associated with the die;
determining, for each command of the plurality of commands, a respective partition number derived from the updated base partition number;
in response to determining that a first partition number for a first command of the plurality of commands satisfies a threshold criterion, setting a second partition number for a second command of the plurality of commands to an initial value;
determining, using the base page address, a respective page address associated with each command of the plurality of commands; and
executing the plurality of commands using, for each command of the plurality of commands, the respective partition number and the respective page address.

9. The method of claim 8, wherein the first partition number for the first command of the plurality of commands is the updated base partition number incremented by a fixed value.

10. The method of claim 8, further comprising:
identifying a partition offset associated with the die;
identifying a plurality of wordlines corresponding to the page address associated with each command of the plurality of commands; and
updating each wordline of the plurality of wordlines based on the partition offset.

11. The method of claim 8, further comprising:
identifying a partition offset associated with the die;
identifying a plurality of bitlines corresponding to the page address associated with each command of the plurality of commands; and
updating each bitline of the plurality of bitlines based on the partition offset.

12. The method of claim 8, further comprising:
determining that the first partition number for the first command of the plurality of commands does not satisfy a threshold criterion; and
responsive to determining that the first partition number for the first command of the plurality of commands does not satisfy the threshold criterion, incrementing the first partition number by the fixed value for the second command of the plurality of commands.

13. The method of claim 8, wherein determining, using the base page address, the respective page address associated with each command of the plurality of commands comprises:
determining that the first partition number for the first command of the plurality of commands does not satisfy a threshold criterion; and
responsive to determining that the first partition number for the first command of the plurality of commands does not satisfy the threshold criterion, updating a page address associated with the second command of the plurality of commands with an address corresponding to the base page address.

14. The method of claim 8, wherein determining, using the base page address, the respective page address associated with each command of the plurality of commands comprises:
determining that the first partition number for the first command of the plurality of commands satisfies a threshold criterion;
incrementing, by a fixed value, a page address associated with the first command for the second command of the plurality of commands; and
updating a page address associated with the second command with the incremented page address.

15. A non-transitory computer-readable storage medium comprising instructions that, when executed by a processing device, cause the processing device to perform operations comprising:
receiving a memory access command to be performed on a die of the memory device, wherein the memory access command comprises a base partition number and a base page address;
determining a number of partitions associated with the die;
converting the memory access command into a plurality of commands, wherein a number of commands comprised by the plurality of commands is equal to the number of partitions associated with the die;

determining, for each command of the plurality of commands, a respective partition number derived from the base partition number;

in response to determining that a first partition number for a first command of the plurality of commands satisfies a threshold criterion, setting a second partition number for a second command of the plurality of commands to an initial value;

determining, using the base page address, a respective page address associated with each command of the plurality of commands; and executing the plurality of commands using, for each command of the plurality of commands, the respective partition number and the respective page address.

16. The non-transitory computer-readable storage medium of claim 15, wherein the first partition number for the first command of the plurality of commands is the base partition number incremented by a fixed value.

17. The non-transitory computer-readable storage medium of claim 15, wherein the processing device is to perform operations further comprising:

identifying a partition offset associated with the die;

identifying a plurality of wordlines corresponding to the page address associated with each command of the plurality of commands; and updating each wordline of the plurality of wordlines based on the partition offset.

18. The non-transitory computer-readable storage medium of claim 15, wherein the processing device is to perform operations further comprising:

identifying a partition offset associated with the die;

identifying a plurality of bitlines corresponding to the page address associated with each command of the plurality of commands; and updating each bitline of the plurality of bitlines based on the partition offset.

19. The non-transitory computer-readable storage medium of claim 15, wherein the processing device is to perform operations further comprising:

determining that the first partition number for the first command of the plurality of commands does not satisfy a threshold criterion; and responsive to determining that the first partition number for the first command of the plurality of commands does not satisfy the threshold criterion, incrementing the first partition number by the fixed value for the second command of the plurality of commands.

20. The non-transitory computer-readable storage medium of claim 15, wherein determining, using the base page address, the respective page address associated with each command of the plurality of commands comprises:

determining that the first partition number for the first command of the plurality of commands does not satisfy a threshold criterion; and responsive to determining that the first partition number for the first command of the plurality of commands does not satisfy the threshold criterion, updating a page address associated with the second command of the plurality of commands with an address corresponding to the base page address.

* * * * *